(12) United States Patent  
Miyairi et al.

(10) Patent No.: US 8,546,810 B2  
(45) Date of Patent: Oct. 1, 2013

(54) THIN FILM TRANSISTOR, DISPLAY DEVICE, AND ELECTRONIC APPLIANCE

(75) Inventors: Hidekazu Miyairi, Kanagawa (JP); Yasuhiro Jinbo, Kanagawa (JP); Hiromichi Godo, Kanagawa (JP); Takafumi Mizoguchi, Kanagawa (JP); Shinobu Furukawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 567 days.

(21) Appl. No.: 12/788,343

(22) Filed: May 27, 2010

(65) Prior Publication Data

US 2010/0301346 A1    Dec. 2, 2010

(30) Foreign Application Priority Data

May 28, 2009    (JP) ................................ 2009-128691

(51) Int. Cl.
    *H01L 27/14*     (2006.01)  
    *H01L 29/04*     (2006.01)  
    *H01L 29/15*     (2006.01)  
    *H01L 31/036*    (2006.01)

(52) U.S. Cl.
USPC ............... 257/72; 257/40; 257/59; 257/69; 257/E27.001; 257/E27.13; 257/E27.132; 257/E51.001; 438/34; 438/82; 438/99; 349/38; 349/39; 349/42; 349/43; 349/46; 349/47; 349/56; 349/122; 349/138; 349/142; 345/92; 345/695

(58) Field of Classification Search
USPC ............ 257/40, 59, 69, 72, E27.001, E27.13, 257/E27.132, E51.001; 438/34, 82, 99; 349/39, 38, 42, 43, 46, 47, 56, 122, 138, 349/142, FOR. 111; 345/695, 92  
See application file for complete search history.

(56) References Cited

U.S. PATENT DOCUMENTS 4,409,134 A    10/1983   Yamazaki  
5,101,242 A     3/1992   Ikeda et al.  
(Continued)

FOREIGN PATENT DOCUMENTS

EP      0 535 979 A2    4/1993  
JP      57-071126 A     5/1982  
(Continued)

OTHER PUBLICATIONS

Kim.C et al., "42.1 A Novel Four-Mask-Count Process Architecture for TFT-LCDs,", SID Digest '00 : SID International Symposium Digest of Technical Papers, 2000, vol. 31, pp. 1006-1009.

(Continued)

*Primary Examiner* — Meiya Li  
(74) *Attorney, Agent, or Firm* — Nixon Peabody LLP; Jeffrey L. Costellia

(57) ABSTRACT

A thin film transistor in which an effect of photo current is small and an On/Off ratio is high is provided. In a bottom-gate bottom-contact (coplanar) thin film transistor, a channel formation region overlaps with a gate electrode, a first impurity semiconductor layer is provided between the channel formation region and a second impurity semiconductor layer which is in contact with a wiring layer. A semiconductor layer which serves as the channel formation region and the first impurity semiconductor layer preferably overlap with each other in a region where they overlap with the gate electrode. The first impurity semiconductor layer and the second impurity semiconductor layer preferably overlap with each other in a region where they do not overlap with the gate electrode.

20 Claims, 10 Drawing Sheets

(56) References Cited

U.S. PATENT DOCUMENTS

| | | |
|---|---|---|
| 5,221,631 A | 6/1993 | Ikeda et al. |
| 5,453,858 A | 9/1995 | Yamazaki |
| 5,514,879 A | 5/1996 | Yamazaki |
| 5,591,987 A | 1/1997 | Yamazaki et al. |
| 5,614,732 A | 3/1997 | Yamazaki |
| 5,648,662 A | 7/1997 | Zhang et al. |
| 5,677,236 A | 10/1997 | Saitoh et al. |
| 5,701,167 A | 12/1997 | Yamazaki |
| 5,766,989 A | 6/1998 | Maegawa et al. |
| 5,849,601 A | 12/1998 | Yamazaki |
| 5,859,445 A | 1/1999 | Yamazaki |
| 5,864,150 A | 1/1999 | Lin |
| 5,932,302 A | 8/1999 | Yamazaki et al. |
| 6,011,277 A | 1/2000 | Yamazaki |
| 6,023,075 A | 2/2000 | Yamazaki |
| 6,091,467 A | 7/2000 | Kubo et al. |
| 6,153,893 A | 11/2000 | Inoue et al. |
| 6,171,674 B1 | 1/2001 | Yamazaki et al. |
| 6,183,816 B1 | 2/2001 | Yamazaki et al. |
| 6,252,249 B1 | 6/2001 | Yamazaki |
| 6,281,520 B1 | 8/2001 | Yamazaki |
| 6,306,213 B1 | 10/2001 | Yamazaki |
| 6,468,617 B1 | 10/2002 | Yamazaki et al. |
| 6,468,839 B2 | 10/2002 | Inoue et al. |
| 6,737,676 B2 | 5/2004 | Yamazaki |
| 6,756,258 B2 | 6/2004 | Zhang et al. |
| 6,835,523 B1 | 12/2004 | Yamazaki et al. |
| 7,067,844 B2 | 6/2006 | Yamazaki |
| 7,098,479 B1 | 8/2006 | Yamazaki |
| 7,115,902 B1 | 10/2006 | Yamazaki |
| 7,199,846 B2 | 4/2007 | Lim |
| 2005/0022864 A1 | 2/2005 | Fujioka et al. |
| 2005/0115930 A1 | 6/2005 | Tanaka et al. |
| 2007/0181945 A1 | 8/2007 | Nakamura |
| 2009/0002591 A1 | 1/2009 | Yamazaki et al. |
| 2009/0033818 A1 | 2/2009 | Nakajima et al. |
| 2009/0057683 A1 | 3/2009 | Nakajima et al. |
| 2009/0061574 A1 | 3/2009 | Nakajima et al. |
| 2009/0321737 A1 | 12/2009 | Isa et al. |

FOREIGN PATENT DOCUMENTS

| | | |
|---|---|---|
| JP | 58-092217 A | 6/1983 |
| JP | 59-072781 A | 4/1984 |
| JP | 04-266019 A | 9/1992 |
| JP | 05-129608 A | 5/1993 |
| JP | 06-326312 A | 11/1994 |
| JP | 07-131030 A | 5/1995 |
| JP | 10-020298 A | 1/1998 |
| JP | 2000-277439 A | 10/2000 |
| JP | 2001-007024 A | 1/2001 |
| JP | 2001-053283 A | 2/2001 |
| JP | 2004-014958 A | 1/2004 |
| JP | 2005-049832 A | 2/2005 |
| JP | 2005-167051 A | 6/2005 |
| JP | 2005-191546 A | 7/2005 |
| JP | 2008-124392 | 5/2008 |
| JP | 2008-124392 A | 5/2008 |
| JP | 2009-044134 A | 2/2009 |
| WO | WO-2004/086487 | 10/2004 |
| WO | WO 2008041462 A1 * | 4/2008 |

OTHER PUBLICATIONS

Arai.T et al., "41.2: Micro Silicon Technology for Active Matrix OLED Display,", SID Digest '07 : SID International Symposium Digest of Technical Papers, 2007, vol. 38, pp. 1370-1373.

Fujiwara.H et al., "Stress-Induced Nucleation of Microcrystalline Silicon from Amorphous Phase,", Jpn. J. Appl. Phys. (Japanese Journal of Applied Physics) , May 15, 2002, vol. 41, No. 5A, pp. 2821-2828.

Kamei.T et al., "A Significant Reduction of Impurity Contents in Hydrogenated Microcrystalline Silicon Films for Increased Grain Size and Reduced Defect Density,", Jpn. J. Appl. Phys. (Japanese Journal of Applied Physics) , Mar. 1, 1998, vol. 37, No. 3A, pp. L265-L268.

Lee.C et al., "Directly Deposited Nanocrystalline Silicon Thin-Film Transistors With Ultra High Mobilities,", Appl. Phys. Lett. (Applied Physics Letters) , Dec. 18, 2006, vol. 89, No. 25, pp. 252101-1-252101-3.

Song.J et al., 34.1: "Advanced Four-Mask Process Architecture for the A-Si TFT Array Manufacturing Method,", SID Digest '02 : SID International Symposium Digest of Technical Papers, 2002, vol. 32, pp. 1038-1041.

Choi.S et al., "P-16: Novel Four-Mask Process in the FFS TFT-LCD With Optimum Multiple-Slit Design Applied by the Use of a Gray-Tone Mask,", SID Digest '05 : SID International Symposium Digest of Technical Papers, 2005, vol. 36, pp. 284-287.

Lee.C et al., "High-Mobility Nanocrystalline Silicon Thin-Film Transistors Fabricated by Plasma-Enhanced Chemical Vapor Deposition,", Appl. Phys. Lett. (Applied Physics Letters) , May 24, 2005, vol. 86, pp. 222106-1-222106-3.

Lee.C et al., "High-Mobility N-Channel and P-Channel Nanocrystalline Silicon Thin-Film Transistors,", IEDM 05: Technical Digest of International Electron Devices Meeting, 2005, pp. 937-940.

Lee.C et al., "How to Achieve High Mobility Thin Film Transistors by Direct Deposition of Silicon Using 13.56 MHZ RF PECVD?,", IEDM, 2006, pp. 295-298.

Esmaeili-Rad.M et al., "High Stability, Low Leakage Nanocrystalline Silicon Bottom Gate Thin Film Transistors for AMOLED Displays,", IEDM 06: Technical Digest of International Electron Devices Meeting, 2006, pp. 303-306.

Lee.H et al., "Leakage Current Mechanisms in Top-Gate Nanocrystalline Silicon Thin-Film Transistors,", Appl. Phys. Lett. (Applied Physics Letters) , Feb. 28, 2008, vol. 92, pp. 083509-1-083509-3.

Lee.C et al., "Stability of NC-Si:H TFTs With Silicon Nitride Gate Dielectric,", IEEE Transactions on Electron Devices, 2007, vol. 54, No. 1, pp. 45-51.

Sazonov.A et al., "Low-Temperature Materials and Thin Film Transistors for Flexible Electronics,", Proceedings of the IEEE, Aug. 1, 2005, vol. 93, No. 8, pp. 1420-1428.

Lee.C et al., "Top-Gate TFTs Using 13.56MHZ PECVD Microcrystalline Silicon,", IEEE Electron Device Letters, Sep. 5, 2005, vol. 26, No. 9, pp. 637-639.

Lee.C et al., "Postdeposition Thermal Annealing and Material Stability of 75° C. Hydrogenated Nanocrystalline Silicon Plasma-Enhanced Chemical Vapor Deposition Films ,", J. Appl. Phys. (Journal of Applied Physics) , Aug. 4, 2005, vol. 98, No. 3, pp. 034305-1-034305-7.

Fujiwara.H et al., "Microcrystalline silicon nucleation sites in the sub-surface of hydrogenated amorphous silicon,", Surface Science, 2002, vol. 497, No. 1-3, pp. 333-340.

Fujiwara.H et al., "Real-time spectroscopic ellipsometry studies of the nucleation and grain growth processes in microcrystalline silicon thin films,", Phys. Rev. B (Physical Review. B), Feb. 23, 2001, vol. 63, pp. 115306-1-115306-9.

"Invitation to pay additional fees (application No. PCT/JP2009/061795;PCT11623/12200/12401), International Searching Authority, dated Jul. 28, 2009,".

* cited by examiner

THIN FILM TRANSISTOR, DISPLAY DEVICE, AND ELECTRONIC APPLIANCE

BACKGROUND OF THE INVENTION

1. Field of the Invention

One embodiment of the present invention relates to a thin film transistor and a manufacturing method thereof and a display device and a manufacturing method thereof. One embodiment of the present invention further relates to an electronic appliance.

2. Description of the Related Art

Recently, a thin film transistor (hereinafter, referred to as a TFT) in which a semiconductor thin film (the thickness is approximately several nanometers to several hundreds of nanometers) is provided over a substrate having an insulating surface (e.g., a glass substrate) has attracted attention. The development of TFTs, for example, as switching elements of a display device such as a liquid crystal display device and the like has been accelerated. As a semiconductor thin film of the TFTs, an amorphous semiconductor film or a polycrystalline semiconductor film is mainly used. There are also TFTs in which a microcrystalline semiconductor film is used (e.g., Patent Document 1). In a display device, switching characteristic of the mounted TFTs has influence on a display quality, power consumption, and the like.

One of the parameters that determine the switching characteristic of the TFT is an On/Off ratio of current. Here, an On/Off ratio of current refers to a ratio of ON current to OFF current. Note that OFF current refers to current flowing between a source and a drain when the TFT is OFF while ON current refers to current flowing between the source and the drain when the TFT is ON. Consequently, in order to increase an On/Off ratio of current, ON current may be increased and OFF current may be decreased.

Note that in this specification, the term a "source" alone refers to either or both of a source electrode and a source region and the two are not particularly distinguished. Similarly, the term a "drain" alone refers to either or both of a drain electrode and a drain region and the two are not particularly distinguished.

Note that in the TFT, a high On/Off ratio is not the only requirement. It is also important to reduce light-induced leakage current, for example. Here, light-induced leakage current refers to unintended current which flows between the source and the drain due to a photovoltaic effect when light reaches a semiconductor thin film in the TFT. Particularly, since a TFT which is used as a pixel transistor of a liquid crystal display device receives light from a backlight on a substrate side, light-induced leakage current should be sufficiently small. Accordingly, there have been a lot of developments in a technique for shielding the semiconductor thin film of the TFT from light (Patent Document 2, for example).

REFERENCE

[Patent Document 1] Japanese Published Patent Application No. 2009-44134
[Patent Document 2] Japanese Published Patent Application No. H10-20298

SUMMARY OF THE INVENTION

According to one embodiment of the present invention, an object is to provide a TFT with a high On/Off ratio and small light-induced leakage current.

In addition, according to one embodiment of the present invention, another object is to provide a display device with a high contrast ratio and low power consumption.

One embodiment of the present invention is a TFT and a manufacturing method thereof which includes a semiconductor layer serving as a channel formation region that is shielded from light by overlapping with the first wiring layer, a first impurity semiconductor layer which is provided to be in contact with the semiconductor layer serving as a channel formation region, a second impurity semiconductor layer which is provided to be in contact with the first impurity semiconductor layer and not to be in contact with the semiconductor layer serving as a channel formation region, and a second wiring layer over the entire surface of the second impurity semiconductor layer. A contact area between the semiconductor layer serving as a channel formation region and the first impurity semiconductor layer overlaps with the first wiring layer. A contact area between the first impurity semiconductor layer and the second impurity semiconductor layer does not overlap with the first wiring layer.

Note that in the TFT having the above structure according to one embodiment of the present invention, the first wiring layer may form at least a gate electrode of the TFT and the second wiring layer may form at least a source electrode and a drain electrode of the TFT.

Further, one embodiment of the present invention is a display device and a manufacturing method thereof in which a pixel electrode is connected to the TFT having the above structure.

Note that in this specification, a "film" refers to a film which is formed over the entire surface of an object by a CVD method (including a plasma CVD method and the like) or a sputtering method. On the other hand, a "layer" refers to a layer which is formed by processing a film or a layer which is formed over the entire surface of an object and which is not subjected to processing. However, a "film" and a "layer" do not have to be particularly distinguished.

According to one embodiment of the present invention, a TFT with small light-induced leakage current and a high On/Off ratio can be obtained.

According to one embodiment of the present invention, a display device with a high contrast ratio and low power consumption can be obtained.

DETAILED DESCRIPTION OF THE INVENTION

Figure 1:
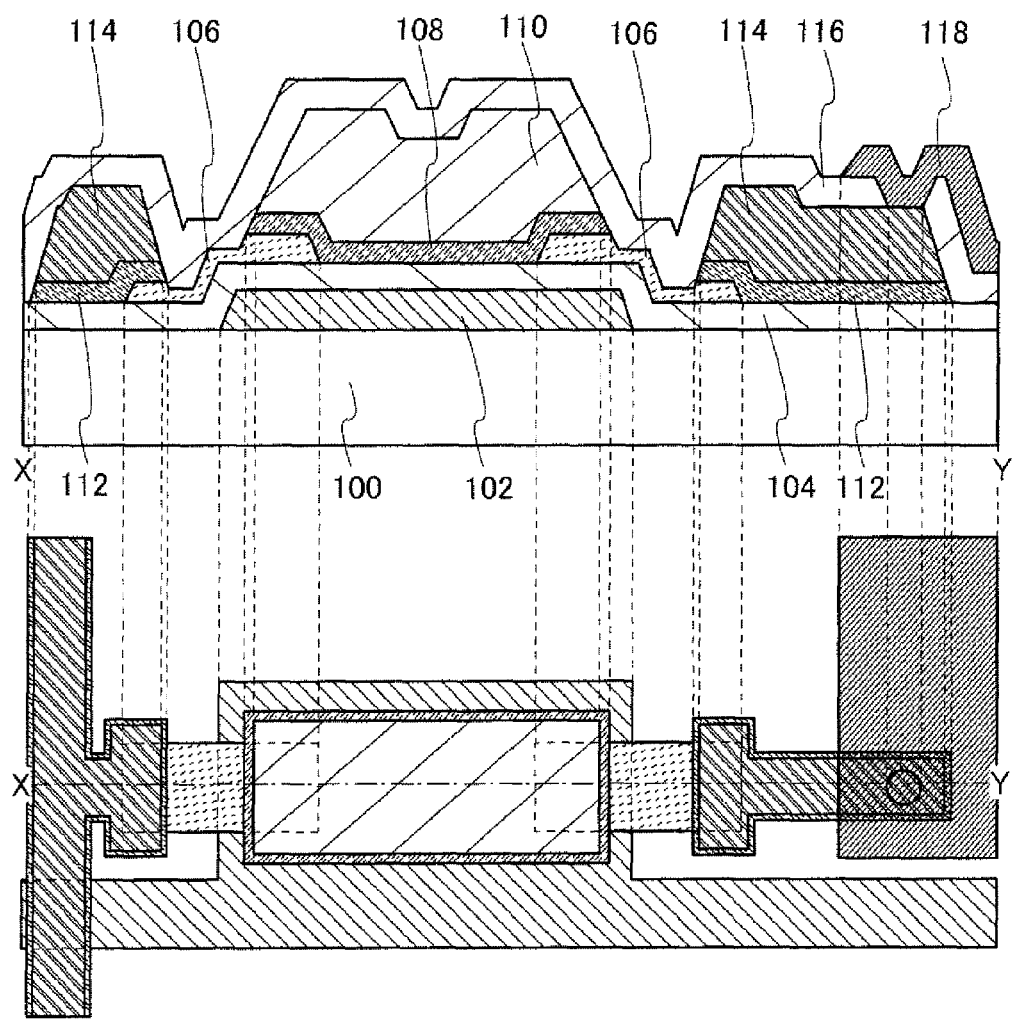
FIG. 1 is a cross-sectional view and a top view illustrating a TFT according to one embodiment of the present invention.

Hereinafter, embodiments of the present invention will be described in detail with reference to the accompanying drawings. Note that the present invention is not limited to the following description and it will be readily appreciated by those skilled in the art that modes and details can be modified in various ways without departing from the spirit and the scope of the present invention. Therefore, the present invention is not construed as being limited to the description of the embodiments given below. Note that like portions in the drawings may be denoted by the like reference numerals in structures of the present invention to be given below. Note that the same hatch pattern is applied to similar parts, and the similar parts are not especially denoted by reference numerals in some cases. In addition, an insulating layer is not illustrated in a top view in some cases for convenience.

Embodiment 1

In Embodiment 1, a TFT according to one embodiment of the present invention and a manufacturing method thereof will be described.

The TFT in this embodiment includes a first wiring layer, a gate insulating layer that covers the first wiring layer, a pair of first impurity semiconductor layers which is over the gate insulating layer and partly overlaps with the first wiring layer, a semiconductor layer serving as a channel formation region provided between the pair of first impurity semiconductor layers and in contact with at least the pair of first impurity semiconductor layers, a second impurity semiconductor layer that covers at least end portions of the pair of first impurity semiconductor layers and is spaced from the semiconductor layer serving as a channel formation region, and a second wiring layer over the entire surface of the second impurity semiconductor layer.

Note that the first wiring layer may form at least a gate electrode and a gate wiring in the above structure. In addition, the second wiring layer may form at least a source electrode, a drain electrode, and a source wiring.

In the TFT having the above structure, a channel stop layer is preferably provided over the semiconductor layer serving as a channel formation region. This is because when the channel stop layer is provided over the semiconductor layer serving as a channel formation region, the thickness of the semiconductor layer serving as a channel formation region is prevented from being reduced by etching; consequently, variations in electric characteristics between TFTs can be reduced.

In the TFT having the above structure, it is preferable that the second wiring layer and the second impurity semiconductor layer be in contact with each other in a region where they do not overlap with the first wiring layer.

In the TFT having the above structure, it is preferable that the concentration of an impurity element imparting one-type conductivity included in the first impurity semiconductor layer be preferably lower than the concentration of an impurity element imparting one-type conductivity included in the second impurity semiconductor layer. It is particularly preferable that the concentration of the impurity element imparting one-type conductivity included in the second impurity semiconductor layer be $1.0 \times 10^{19}$ cm$^{-3}$ to $1.0 \times 10^{21}$ cm$^{-3}$ inclusive, and the concentration of the impurity element imparting one-type conductivity included in the first impurity semiconductor layer be $1.0 \times 10^{18}$ cm$^{-3}$ to $1.0 \times 10^{19}$ cm$^{-3}$ inclusive. This is because by making the concentration of the impurity element imparting one-type conductivity included in the first impurity semiconductor layer be lower than the concentration of the impurity element imparting one-type conductivity included in the second impurity semiconductor layer, the first impurity semiconductor layer can serve as an LDD (lightly doped drain) region.

Note that in this specification, the concentration is measured by secondary ion mass spectroscopy (hereinafter, referred to as SIMS) unless otherwise specifically stated.

A method for manufacturing the TFT in this embodiment includes the steps of forming the first wiring layer, forming the gate insulating layer to cover the first wiring layer, forming the first impurity semiconductor layer over the gate insulating layer, forming a stack including a semiconductor film and an insulating film to cover the first impurity semiconductor layer, forming the channel stop layer by etching the insulating film, forming the semiconductor layer serving as a channel formation region by etching using the channel stop layer, and forming a stack including the second impurity semiconductor layer and the second wiring layer to be in contact with at least the first impurity semiconductor layer.

In the manufacturing method for the TFT having the above structure, the first impurity semiconductor film which becomes the first impurity semiconductor layer is preferably thicker than the semiconductor film and the second impurity semiconductor film which becomes the second impurity semiconductor layer. This is for the purpose of preventing breakage of the first impurity semiconductor layer due to a plurality of etching steps to which the first impurity semiconductor film is subjected.

First, the TFT in this embodiment is described with reference to FIG. 1.

The TFT in FIG. 1 includes a first wiring layer 102; a gate insulating layer 104 that covers the first wiring layer 102; a pair of first impurity semiconductor layers 106 which is over the gate insulating layer 104 and partly overlaps with the first wiring layer 102; a semiconductor layer 108 serving as a channel formation region provided between the first impurity semiconductor layers 106 and in contact with at least the first impurity semiconductor layer 106; a channel stop layer 110 over the semiconductor layer 108; a second impurity semiconductor layer 112 that covers at least end portions of the first impurity semiconductor layers 106, is spaced from the semiconductor layer 108, and serves as a source region or a drain region; and a second wiring layer 114 over the entire surface of the second impurity semiconductor layer 112.

Note that the first wiring layer 102 may form at least a gate electrode and a gate wiring in the above structure. In addition, the second wiring layer 114 may form at least a source electrode, a drain electrode, and a source wiring.

Note that, the TFT in FIG. 1 can be applied to a pixel transistor. Thus, the TFT in FIG. 1 is covered with a protective insulating layer 116 and includes a pixel electrode layer 118 which is connected to the second wiring layer 114 through an opening in the protective insulating layer 116.

In the TFT in FIG. 1, the channel stop layer 110 is provided over the semiconductor layer 108. Consequently, oxidation of the surface of the semiconductor layer 108 can be prevented, whereby a substance which may cause a leakage path can be prevented from attaching to the surface of the semiconductor layer 108; therefore, OFF current can be decreased.

In the TFT in FIG. 1, since the channel stop layer 110 is provided over the semiconductor layer 108, the thickness of the semiconductor layer 108 can be prevented from being reduced during a manufacturing process. Therefore, a reduction in carrier mobility of the semiconductor layer 108 can be prevented; accordingly, a reduction in ON current of the TFT can also be suppressed. Further, the thickness of the semiconductor layer 108 can be more uniform, whereby variations in characteristics between TFTs over the substrate can be prevented. In addition, since the channel stop layer 110 is provided over the semiconductor layer 108 and an impurity semiconductor film is not formed over the entire surface of the semiconductor layer 108 during the manufacturing process, OFF current through the semiconductor layer 108 can be kept low.

In the TFT in FIG. 1, since the semiconductor layer 108, the first impurity semiconductor layer 106, the second impurity semiconductor layer 112, and the second wiring layer 114 do not have a region where holes easily flow, even when the gate electrode is reverse biased and the conductivity type of the channel formation region is inverted, OFF current can be kept low. Further, a material for the second wiring layer 114 can be selected without taking the work function into consideration.

Further, since the semiconductor layer 108 which serves as the channel formation region overlaps with the first wiring layer 102, light cannot enter the semiconductor layer 108 from a substrate 100 side, whereby light-induced leakage current can be small.

As described above, the TFT in FIG. 1 has small light-induced leakage current and a high On/Off ratio.

Next, a manufacturing method for the TFT in FIG. 1 is describe with reference to FIGS. 2A to 2C, FIGS. 3A to 3C, and FIGS. 4A to 4C.

First, a first conductive film is formed. A resist mask is formed over the first conductive film and etching is performed to form the first wiring layer 102 (see FIG. 2A). In this step, a first photomask is used.

The first conductive film may be formed of a conductive material by a sputtering method, a CVD method, or the like. For example, a metal material such as Mo, Ti, Cr, Ta, W, Al, or Cu, or an alloy material containing any of these metal materials as its main component can be used. Alternatively, an Al alloy material to which Nd or Sc is added may be used. The first conductive film may be a single layer or a stack of plural layers. Here, the thickness of the first conductive film may be 10 nm to 1000 nm inclusive, preferably 10 nm to 500 nm inclusive, more preferably 50 nm to 300 nm inclusive.

Figure 2A:
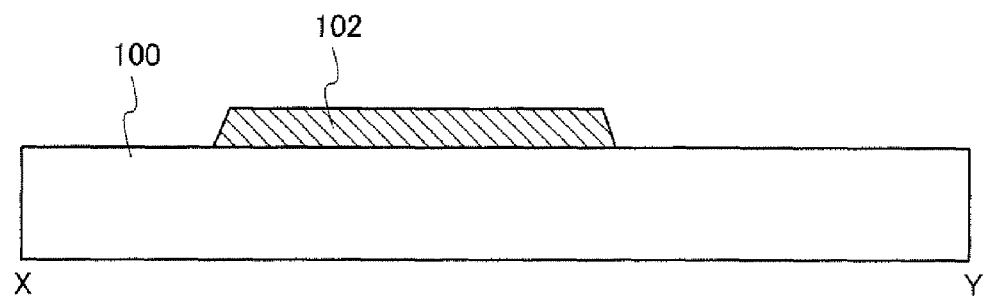
FIGS. 2A to 2C are cross-sectional views illustrating a method for manufacturing a TFT according to one embodiment of the present invention.
Figure 2B:
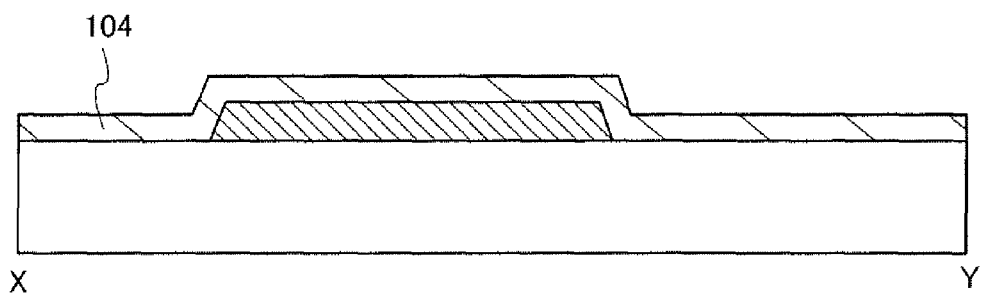

Then, the gate insulating layer 104 is formed to cover the first wiring layer 102 (see FIG. 2B).

The gate insulating layer 104 may be formed of an insulating material by a sputtering method, a CVD method, or the like. As the insulating material, for example, silicon oxide, silicon nitride, silicon oxynitride, or silicon nitride oxide can be used. Note that the gate insulating layer 104 may be a single layer or a stack of plural layers. In the case where a crystalline semiconductor film is formed over the gate insulating layer 104, when the gate insulating layer 104 which is in contact with the crystalline semiconductor film is formed of a silicon oxide layer, the crystallinity of the crystalline semiconductor film can be improved. Thus, in the case where a silicon oxide layer is formed as the gate insulating layer 104, a source gas preferably includes tetraethoxysilane (TEOS) (chemical formula: $Si(OC_2H_5)_4$). Here, the thickness of the gate insulating layer 104 may be 10 nm to 1000 nm inclusive, preferably 10 nm to 550 nm inclusive, more preferably 50 nm to 150 nm inclusive.

Note that here, a crystalline semiconductor film refers to a semiconductor film including a semiconductor having crystallinity.

Note that "silicon oxynitride" here refers to silicon that contains more oxygen than nitrogen and, in the case where measurements are performed using Rutherford backscattering spectrometry (RBS) and hydrogen forward scattering (HFS), preferably includes oxygen, nitrogen, silicon, and hydrogen at concentrations ranging from 50 at. % to 70 at. % inclusive, 0.5 at. % to 15 at. % inclusive, 25 at. % to 35 at. % inclusive, and 0.1 at. % to 10 at. % inclusive, respectively.

Further, "silicon nitride oxide" here refers to silicon that contains more nitrogen than oxygen and, in the case where measurements are performed using RBS and HFS, includes oxygen, nitrogen, silicon, and hydrogen at concentrations ranging from 5 at. % to 30 at. % inclusive, 20 at. % to 55 at. % inclusive, 25 at. % to 35 at. % inclusive, and 10 at. % to 30 at. % inclusive, respectively.

Note that percentages of nitrogen, oxygen, silicon, and hydrogen fall within the ranges given above, where the total number of atoms contained in "silicon oxynitride" or "silicon nitride oxide" is defined as 100 at. %.

Figure 2C:
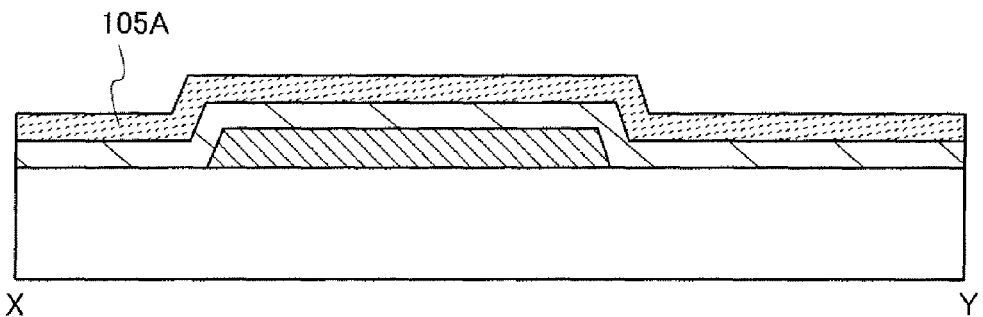

Then, a first impurity semiconductor film 105A is formed over the gate insulating layer 104 (see FIG. 2C).

The first impurity semiconductor film 105A can be formed using a gas in which a gas containing an impurity element imparting one conductivity type is added to a deposition gas such as silane. In the case of forming a TFT having n-type conductivity, for example, phosphorus may be added as the impurity element, and a gas containing an impurity element imparting n-type conductivity, such as phosphine, may be added to silicon hydride. In the case of forming a TFT having p-type conductivity, for example, boron may be added as the impurity element, and a gas containing an impurity element imparting p-type conductivity, such as diborane, may be added to silicon hydride.

Note that there is no particular limitation on the crystallinity of the first impurity semiconductor film 105A. The first impurity semiconductor film 105A may be either crystalline or amorphous, but is preferably formed using a crystalline semiconductor. This is because ON current is increased when the first impurity semiconductor film 105A is formed using a crystalline semiconductor. In the case where the first impurity semiconductor film 105A is formed using a crystalline semiconductor, the flow rate of a dilution gas may be 10 times to 2000 times or 50 times to 200 times the flow rate of a deposition gas. Here, as an example, a silane gas, a mixed gas in which phosphine is diluted with a hydrogen gas to 100 ppm, and a hydrogen gas are introduced as source gases at flow rates of 10 sccm, 30 sccm, and 1470 sccm, respectively, and are stabilized, and the pressure in the process chamber is set at 280 Pa, the substrate temperature is set at 280° C., the RF power source frequency is set at 13.56 MHz, and the electric power is set at 300 W to perform plasma discharge. Thus, the first impurity semiconductor film 105A is formed. The first impurity semiconductor film 105A formed in such a manner includes phosphorus at a concentration of approximately $1.3 \times 10^{19}$ $cm^{-3}$. Alternatively, a silane gas, a mixed gas in which phosphine is diluted with a hydrogen gas to 100 ppm, and a hydrogen gas are introduced as source gases at flow rates of 10 sccm, 150 sccm, and 1350 sccm, respectively, and are stabilized, and the pressure in the process chamber is set at 280 Pa, the substrate temperature is set at 280° C., the RF power source frequency is set at 13.56 MHz, and the electric power is set at 300 W to perform plasma discharge. Thus, the first impurity semiconductor film 105A is formed. The first impurity semiconductor film 105A formed in such a manner includes phosphorus at a concentration of approximately $6.7 \times 10^{19}$ cm$^{-3}$.

Here, the first impurity semiconductor film 105A is preferably formed to be thicker than a semiconductor film 107 and a second impurity semiconductor film 111 which will be described later. The thickness of the first impurity semiconductor film 105A may be 10 nm to 1000 nm inclusive, preferably 20 nm to 200 nm inclusive, more preferably 100 nm to 200 nm inclusive.

Figure 3A:
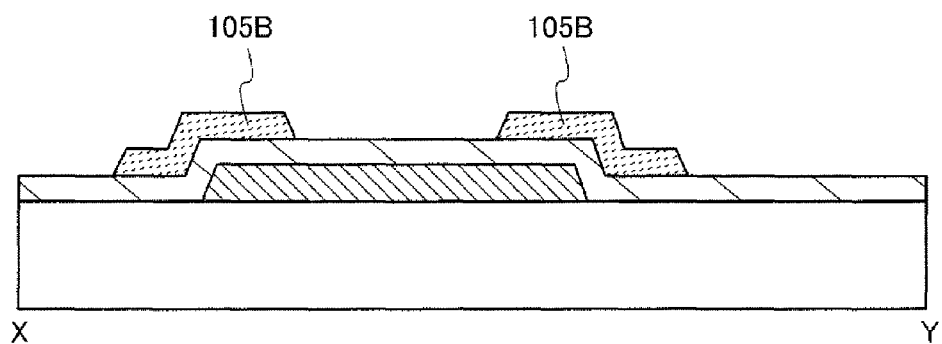
FIGS. 3A to 3C are cross-sectional views illustrating a method for manufacturing a TFT according to one embodiment of the present invention.
Figure 3B:
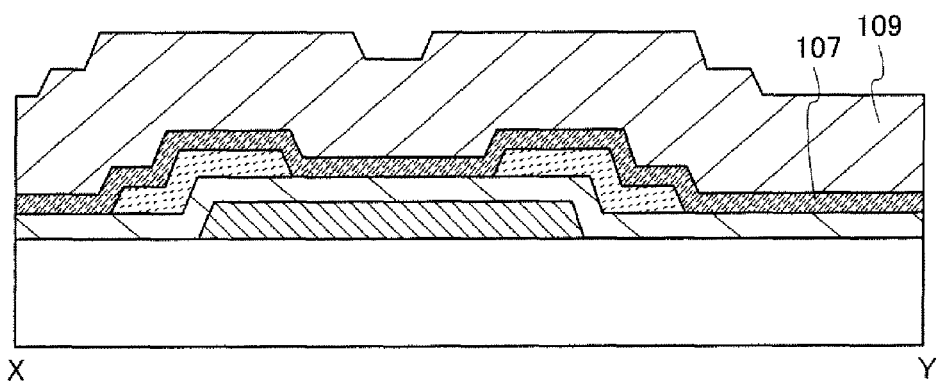

Then, a resist mask is formed over the first impurity semiconductor film 105A and etching is performed to form a first impurity semiconductor layer 105B (see FIG. 3A). In this step, a second photomask is used.

Then, the semiconductor film 107 is formed over the gate insulating layer 104 to cover the first impurity semiconductor layer 105B. An insulating film 109 is formed to cover the semiconductor film 107 (see FIG. 3B).

The semiconductor film 107 is preferably formed of a crystalline semiconductor. Here, although crystalline semiconductor refers to a polycrystalline semiconductor, a microcrystalline semiconductor, and the like, the semiconductor film 107 is preferably formed using a microcrystalline semiconductor which does not require a crystallization step. Note that the semiconductor film 107 is not limited thereto and may be formed of an amorphous semiconductor.

Here, a microcrystalline semiconductor is a semiconductor having an intermediate structure between amorphous and crystalline structures (including a single crystal structure and a polycrystalline structure). A microcrystalline semiconductor is a semiconductor having a third state that is stable in terms of free energy and a crystalline semiconductor having short-range order and lattice distortion, in which columnar or needle-like crystals having a crystal grain size of 2 nm to 200 nm inclusive, preferably 10 nm to 80 nm inclusive, more preferably 20 nm to 50 nm inclusive have grown in a direction normal to the substrate surface. A crystal grain boundary may be formed at the interface of the columnar or needle-like crystals in some cases.

Microcrystalline silicon, which is one of a microcrystalline semiconductor, has a peak of Raman spectrum which is shifted to a lower wave number side than 520 cm$^{-1}$ that represents single crystal silicon. In other words, the peak of the Raman spectrum of the microcrystalline silicon is between a peak at 520 cm$^{-1}$, which represents single crystal silicon, and a peak at 480 cm$^{-1}$, which represents amorphous silicon. Further, hydrogen or halogen is included at 1 at. % or more for termination of dangling bonds. Moreover, by containing a rare gas element such as He, Ar, Kr, or Ne to further promote lattice distortion, a microcrystalline semiconductor with high stability can be obtained.

Note that, when the concentration of oxygen and nitrogen included in the semiconductor film 107 (a value measured by SIMS) is less than $1 \times 10^{18}$ cm$^{-3}$, the crystallinity of the semiconductor film 107 can be improved.

The semiconductor film 107 may be formed of microcrystal silicon by a plasma CVD method or the like, for example. Note that the thickness of the semiconductor film 107 may be 10 nm to 500 nm inclusive, preferably 20 nm to 50 nm inclusive. The thickness of a microcrystalline semiconductor layer can be controlled by a flow rate of silane used in a film formation step and a period of time of the film formation step. Note that, during the film formation, it is preferable that components such as oxygen or nitrogen which interrupt crystallization be reduced, and the flow rate of a dilution gas such as hydrogen be increased with respect to that of a deposition gas such as silane. The flow rate of the dilution gas may be 10 times to 2000 times, preferably 50 times to 200 times that of the deposition gas. In such a manner, a so-called microcrystalline semiconductor film is formed.

The insulating film 109 may be formed of an insulating material by a sputtering method, a CVD method, or the like. As the insulating material, for example, silicon oxide, silicon nitride, silicon oxynitride, or silicon nitride oxide can be used. Note that the insulating film 109 may be a single layer or a stack of plural layers. Here, the thickness of the insulating film 109 may be 10 nm to 1000 nm inclusive, preferably 50 nm to 500 nm inclusive, more preferably 100 nm to 300 nm inclusive. A material which is not or hardly etched during etching of the semiconductor film 107 is selected for the insulating film 109.

Figure 3C:
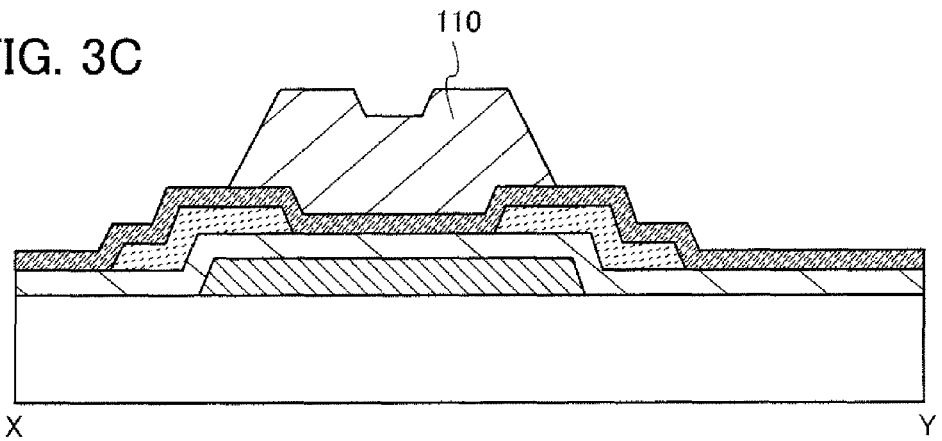

Then, a resist mask is formed over the insulating film 109 and etching is performed to form the channel stop layer 110 (see FIG. 3C). The channel stop layer 110 is used as a mask in the step of etching the semiconductor film 107. In this step, a third photomask is used.

Figure 4A:
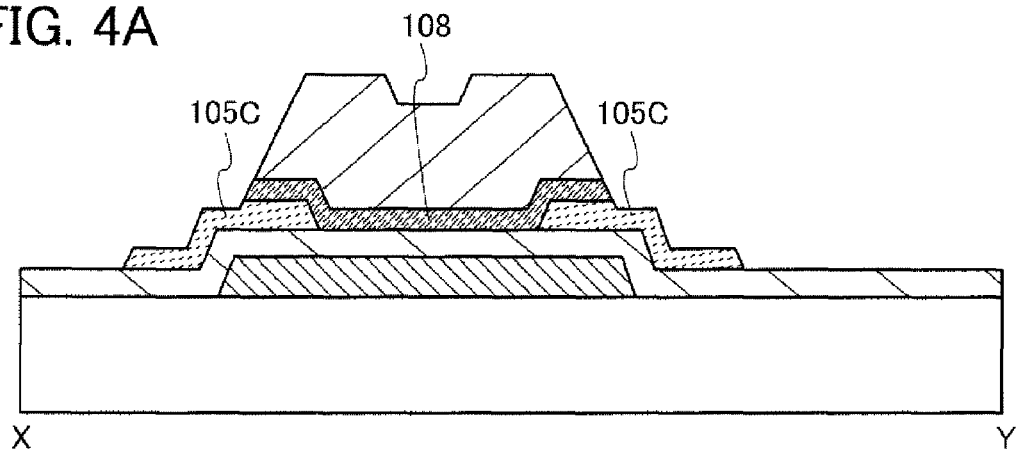
FIGS. 4A to 4C are cross-sectional views illustrating a method for manufacturing a TFT according to one embodiment of the present invention.
Figure 4B:
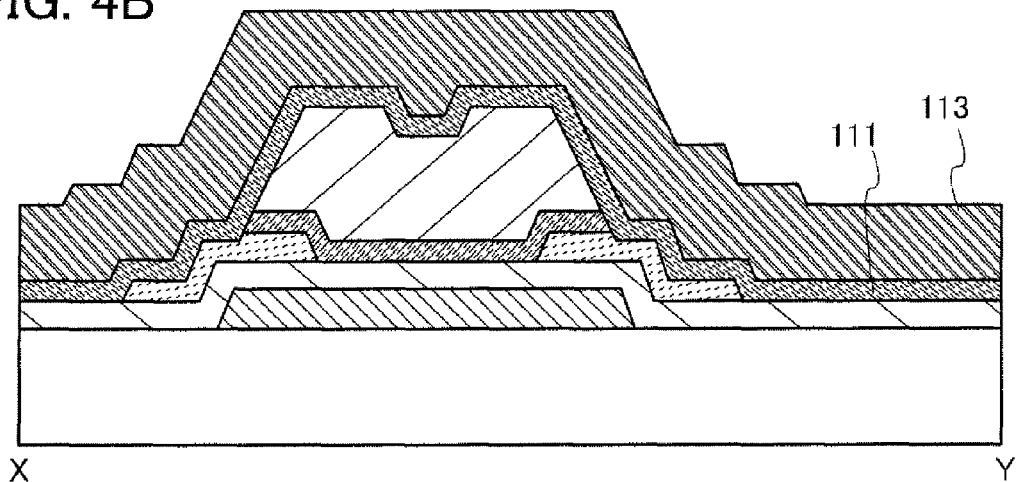

Then, the semiconductor film 107 is etched using the channel stop layer 110 as a mask to form the semiconductor layer 108 (see FIG. 4A). Here, an upper part of the first impurity semiconductor layer 105B is also etched to form a first impurity semiconductor layer 105C.

Then, a second impurity semiconductor film 111 is formed to cover the channel stop layer 110 and the like. A second conductive film 113 is formed to cover the second impurity semiconductor film 111 (see FIG. 4B).

The second impurity semiconductor film 111 can be formed in a manner similar to that of the first impurity semiconductor film 105A.

Note that there is no limitation on the crystallinity of the second impurity semiconductor film 111 as is the case of the first impurity semiconductor film 105A. However, the second impurity semiconductor film 111 is preferably formed using a crystalline semiconductor. This is because ON current is increased when the second impurity semiconductor film 111 is formed using a crystalline semiconductor. In the case where the second impurity semiconductor film 111 is formed using a crystalline semiconductor, the flow rate of a dilution gas may be 10 times to 2000 times or 50 times to 200 times the flow rate of a deposition gas. Here, as an example, a silane gas, a mixed gas in which phosphine is diluted with a hydrogen gas to 0.5 vol %, and a hydrogen gas are introduced as source gases at flow rates of 10 sccm, 30 sccm, and 1500 sccm, respectively, and are stabilized, and the pressure in the process chamber is set at 280 Pa, the substrate temperature is set at 280° C., the RF power source frequency is set at 13.56 MHz, and the electric power is set at 300 W to perform plasma discharge. Thus, the second impurity semiconductor film 111 is formed. The second impurity semiconductor film 111 formed in such a manner includes phosphorus at a concentration of approximately $6.7 \times 10^{20}$ cm$^{-3}$. Note that in the mixed gas, phosphine is diluted to 0.5 vol % here while phosphine is diluted to 100 ppm for forming the first impurity semiconductor film 105A. That is, in the formation of the second impurity semiconductor film 111, the concentration of phosphine is definitely higher than that in the formation of the first impurity semiconductor film 105A.

Here, the second impurity semiconductor film 111 is preferably formed to be thinner than the first impurity semiconductor film 105A. The second impurity semiconductor film 111 preferably has a thickness of 10 nm to 500 nm inclusive, more preferably 20 nm to 100 nm inclusive.

The second conductive film 113 may be formed of a conductive material by a sputtering method, a CVD method, or the like. A material similar to that for the first conductive film can be used for the second conductive film 113. The second conductive film 113 may be a single layer or a stack of plural layers. Here, the thickness of the second conductive film 113 may be 10 nm to 1000 nm inclusive, preferably 50 nm to 500 nm inclusive.

Figure 4C:
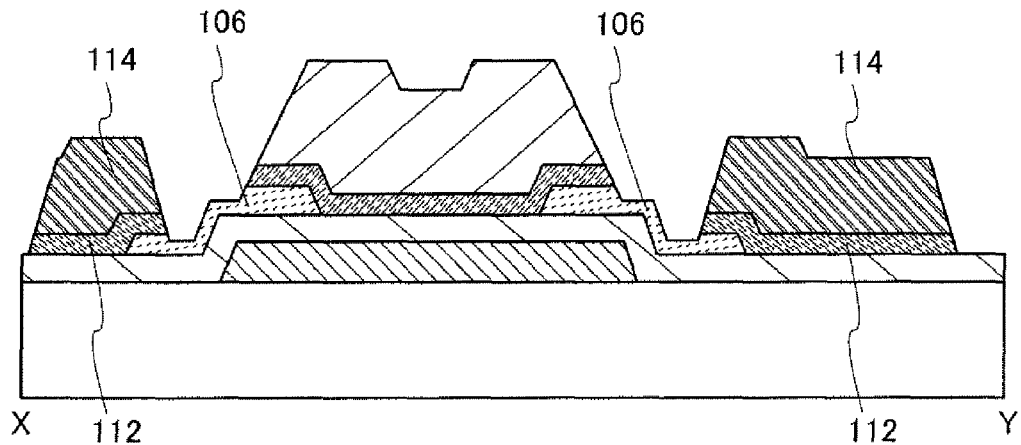

Then, a resist mask is formed over the second conductive film 113 and etching is performed to form the second impurity semiconductor layer 112 and the second wiring layer 114 (see FIG. 4C). In this step, a fourth photomask is used.

As described above, a TFT can be manufactured. Note that as described above, four photomasks are used for forming the TFT in this embodiment.

Then, the protective insulating layer 116 which has an opening reaching the second wiring layer 114 is formed to cover the TFT. A third conductive film is formed to be connected to the second wiring layer 114 through the opening. The third conductive film is etched into the pixel electrode layer 118. Thus, a pixel TFT in FIG. 1 can be completed.

Note that the protective insulating layer 116 may be formed of an insulating material by a sputtering method, a CVD method, or the like and then processed by a photolithography method to have the opening reaching the second wiring layer 114. For example, a material similar to that for the gate insulating layer 104 can be used for the protective insulating layer 116. In particular, the protective insulating layer 116 is preferably formed of silicon nitride. Here, the thickness of the protective insulating layer 116 may be 5 nm to 1000 nm inclusive, preferably 50 nm to 300 nm inclusive. In particular, a dense silicon nitride layer is preferable so that entry of a substance which may be a contaminant substance such as an organic substance, a metal, or moisture contained in the atmosphere can be prevented. A dense silicon nitride layer can be formed by a plasma CVD method using plasma with a frequency of 1 GHz or higher, for example.

The pixel electrode layer 118 can be formed using a conductive composition containing a conductive high molecule (also referred to as a conductive polymer) having a light-transmitting property. As the conductive high molecule, a so-called π-electron conjugated conductive high molecule can be used. For example, polyaniline or a derivative thereof, polypyrrole or a derivative thereof, polythiophene or a derivative thereof, and a copolymer of two or more kinds of those materials can be given. Alternatively, the pixel electrode layer 118 may be formed using, for example, indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added. The pixel electrode layer 118 is preferably formed to have a thickness of 10 nm to 1000 nm inclusive, more preferably 50 nm to 300 nm inclusive.

Note that in the TFT in FIG. 1, the concentration of the impurity element imparting one-type conductivity included in the first impurity semiconductor layer 106 is preferably lower than the concentration of the impurity element imparting one-type conductivity included in the second impurity semiconductor layer 112 so that an LDD region is provided. It is particularly preferable that the concentration of the impurity element imparting one-type conductivity included in the first impurity semiconductor layer 106 be $1.0 \times 10^{18}$ cm$^{-3}$ to $1.0 \times 10^{19}$ cm$^{-3}$ inclusive and that the concentration of the impurity element imparting one-type conductivity included in the second impurity semiconductor layer 112 be $1.0 \times 10^{19}$ cm$^{-3}$ to $1.0 \times 10^{21}$ cm$^{-3}$ inclusive. In the case where an LDD region is provided, an electrical field in the vicinity of the drain region is relaxed and deterioration due to hot carrier injection is suppressed. Therefore, the first impurity semiconductor layer 106 may be formed on only the drain side. Further, in this case, in the TFT in FIG. 1, the first impurity semiconductor layer 106 overlaps with not only the first wiring layer 102 but also the second impurity semiconductor layer 112. Thus, a reduction in ON current can be prevented.

Embodiment 2

In this embodiment, a TFT according to one embodiment of the present invention and a manufacturing method thereof which are different from those described in Embodiment 1 will be described.

In this embodiment, by using the same photomask for formation of the first impurity semiconductor layer, the second impurity semiconductor layer, and the second wiring layer, the number of photomasks used can be reduced.

Note that in this embodiment, the first impurity semiconductor film is preferably thicker than the semiconductor film, which serves as a channel formation region, and the second impurity semiconductor film. This is because the first impurity semiconductor layer is subjected to a plurality of etching steps, and thus should have an enough thickness.

Note that the TFT in this embodiment has a structure different from the TFT in Embodiment 1. The TFT in this embodiment includes a first wiring layer, a gate insulating layer that covers the first wiring layer, a pair of first impurity semiconductor layers which is over the gate insulating layer and partly overlaps with the first wiring layer, a semiconductor layer which is between the pair of first impurity semiconductor layers and in contact with at least the pair of first impurity semiconductor layers, the second impurity semiconductor layer over the pair of first impurity semiconductor layers which is spaced from the semiconductor layer, and the second wiring layer over the entire surface of the second impurity semiconductor layer. In other words, the TFT in this embodiment is different from the TFT in Embodiment 1 in that the second impurity semiconductor layer is provided over the pair of first impurity semiconductor layers.

Note that the first wiring layer may form at least a gate electrode and a gate wiring in the above structure. In addition, the second wiring layer may form at least a source electrode, a drain electrode, and a source wiring.

In the TFT having the above structure, a channel stop layer is preferably provided over the semiconductor layer serving as a channel formation region. This is because if the channel stop layer is provided over the semiconductor layer serving as a channel formation region, the thickness of the semiconductor layer serving as a channel formation region is prevented from being reduced by etching; consequently, variations in electric characteristic between TFTs can be reduced.

In the TFT having the above structure, it is preferable that the second wiring layer and the second impurity semiconductor layer be in contact with each other in a region where they do not overlap with the first wiring layer.

In a manner similar to that of Embodiment 1, in the TFT having the above structure, it is preferable that the concentration of the impurity element imparting one-type conductivity included in the first impurity semiconductor layer be preferably lower than the concentration of the impurity element imparting one-type conductivity included in the second impurity semiconductor layer. It is particularly preferable that the concentration of the impurity element imparting one-type conductivity included in the second impurity semiconductor layer be $1.0 \times 10^{19}$ cm$^{-3}$ to $1.0 \times 10^{21}$ cm$^{-3}$ inclusive, and the concentration of the impurity element imparting one-type conductivity in the first impurity semiconductor layer be $1.0 \times 10^{18}$ cm$^{-3}$ to $1.0 \times 10^{19}$ cm$^{-3}$ inclusive. This is because by thus setting the concentrations, the first impurity semiconductor layer can serve as an LDD (Lightly Doped Drain) region.

Figure 6A:
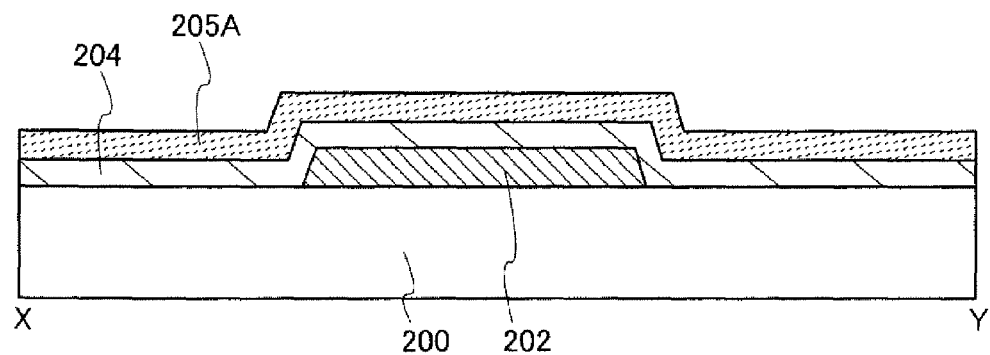
FIGS. 6A to 6C are cross-sectional views illustrating a method for manufacturing a TFT according to one embodiment of the present invention.

First, the steps up to the formation of the first impurity semiconductor film are performed as those in Embodiment 1 (see FIG. 2C). In other words, a first wiring layer 202 is formed over the substrate 200, a gate insulating layer 204 is formed to cover the first wiring layer 202, and a first impurity semiconductor film 205A is formed over the gate insulating layer 204 (see FIG. 6A). Note that a first photomask is used to form the first wiring layer 202.

Figure 6B:
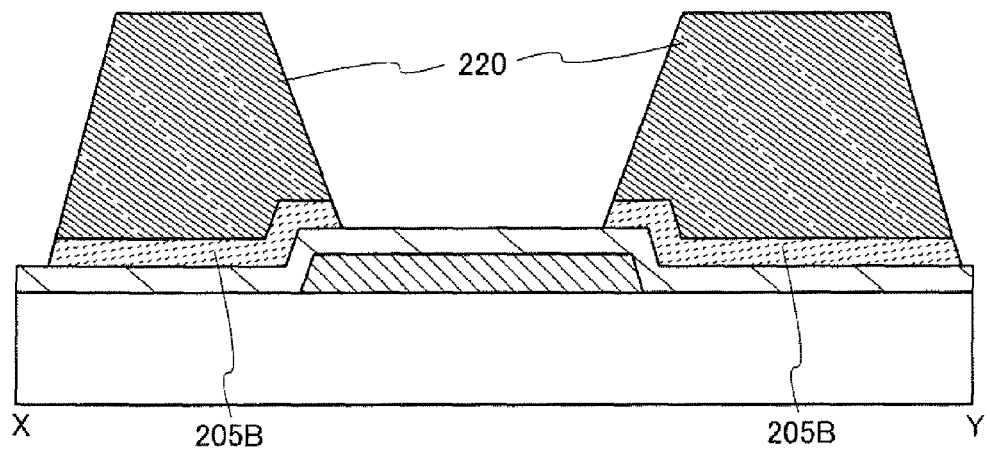

Then, a resist mask 220 is formed over the first impurity semiconductor film 205A and etching is performed to form the first impurity semiconductor layer 205B (see FIG. 6B). A second photomask is used in this step.

Figure 6C:
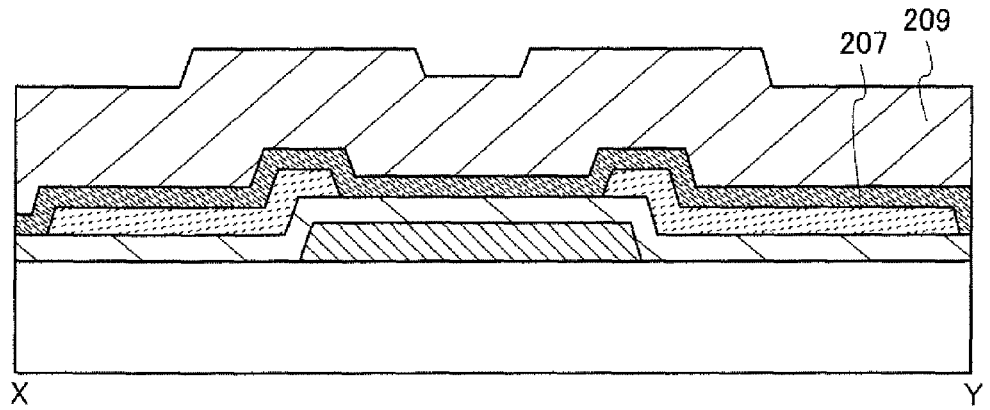

Then, a semiconductor film 207 and an insulating film 209 are formed over the gate insulating layer 204 to cover the first impurity semiconductor layer 205B (see FIG. 6C).

Figure 7A:
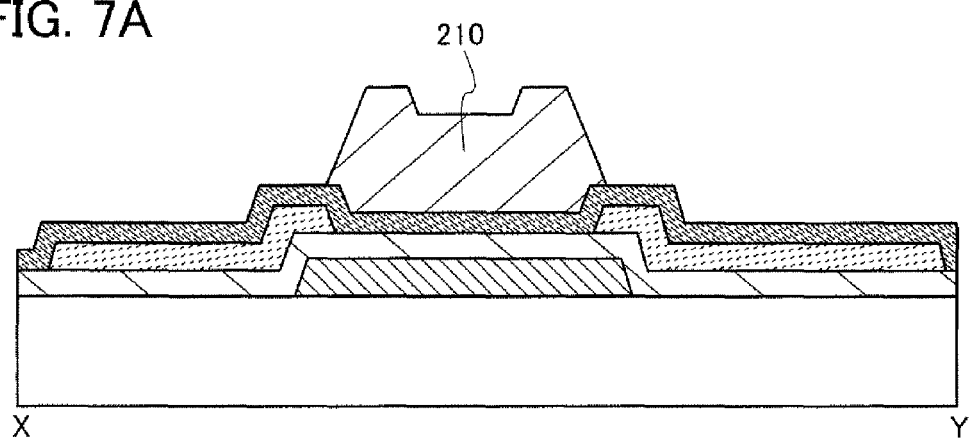
FIGS. 7A to 7C are cross-sectional views illustrating a method for manufacturing a TFT according to one embodi

Then, a resist mask is formed over the insulating film 209 and etching is performed to form a channel stop layer 210 (see FIG. 7A). The channel stop layer 210 is used as a mask in the next step. In this step, a third photomask is used.

Figure 7B:
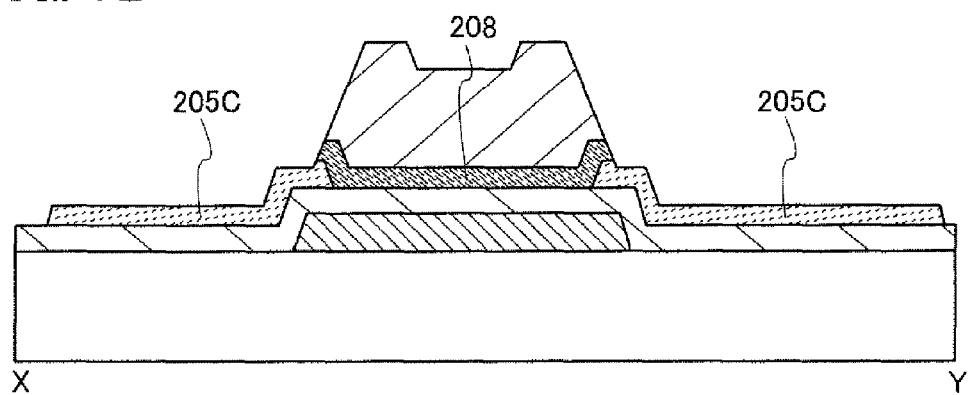

Then, the semiconductor film 207 is etched using the channel stop layer 210 as a mask to form the semiconductor layer 208 (see FIG. 7B). Here, an upper part of the first impurity semiconductor layer 205B is also etched to form a first impurity semiconductor layer 205C.

Figure 7C:
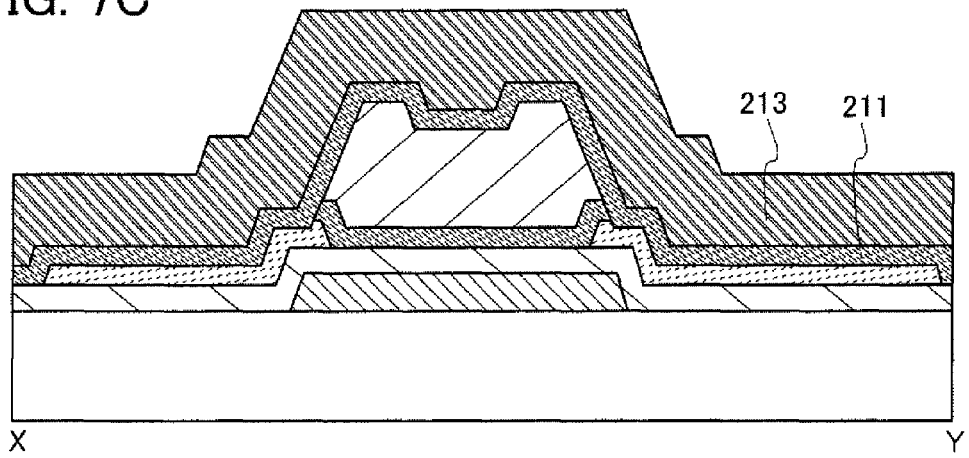

Then, a second impurity semiconductor film 211 is formed to cover the channel stop layer 210 in a manner such that a part of the second impurity semiconductor film 211 is in contact with the semiconductor layer 208. The second conductive film 213 is formed over the second impurity semiconductor film 211 (see FIG. 7C).

Figure 8A:
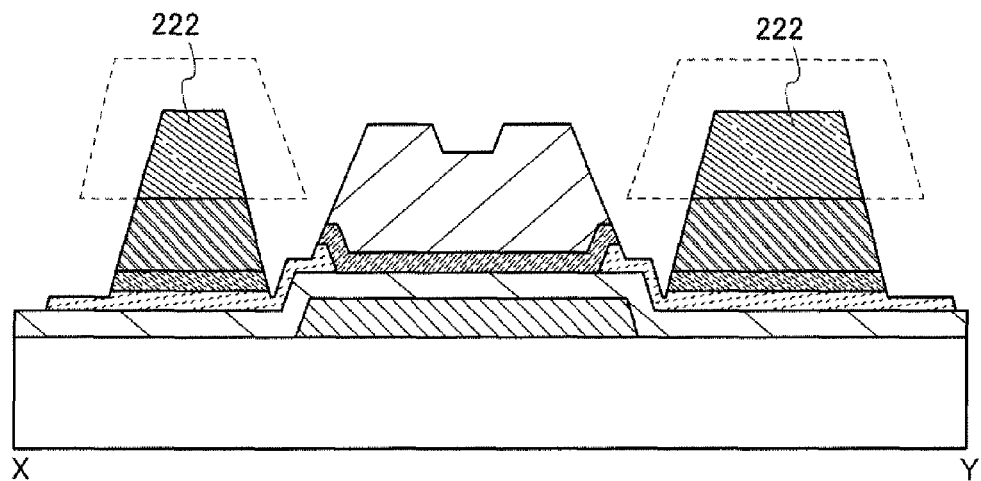
- FIGS. 8A and 8B are cross-sectional views illustrating a method for manufacturing a TFT according to one embodiment of the present invention.

Then, a resist mask 222 is formed over the second conductive film 213 and etching is performed to form a second impurity semiconductor layer 212 and a second wiring layer 214 (see FIG. 8A).

Here, the photomask for forming the resist mask 222 is preferably the same photomask or the photomask having the same shape as the photomask for forming the resist mask 220. In other words, the resist mask 220 is formed over the second conductive film 213 (as denoted by the dotted line in FIG. 8A), and then the resist mask 220 is reduced (is made to recede) to form the resist mask 222.

Note that as a means for reducing the resist mask 220 (making the resist mask 220 recede), for example, an ashing treatment using oxygen plasma can be given. However, there is no limitation and a plasma treatment with water plasma or a treatment with ozone water may be employed instead.

Figure 8B:
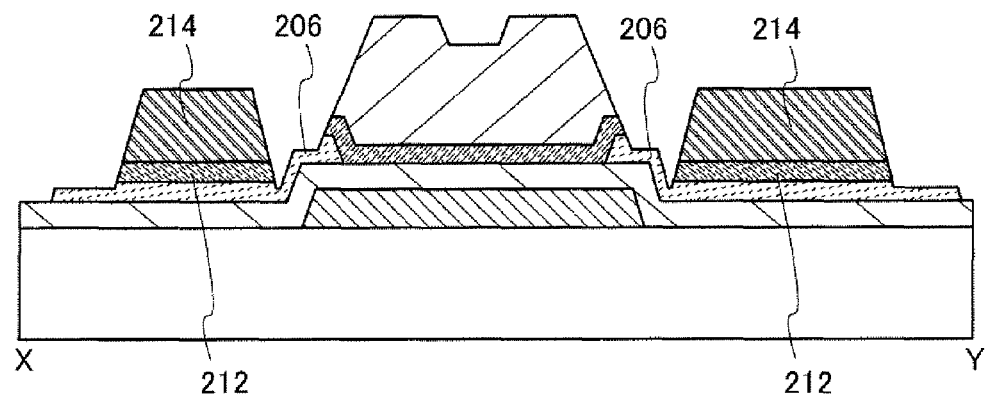

As described above, a TFT can be manufactured (see FIG. 8B). Note that as described above, three photomasks are used for forming the TFT in this embodiment.

Then, the protective insulating layer 216 which has an opening reaching the second wiring layer 214 is formed to cover the TFT. A third conductive film is formed to be connected to the second wiring layer 214 through the opening. The third conductive film is etched into the pixel electrode layer 218. Thus, the pixel transistor in FIG. 5 can be completed.

Figure 5:
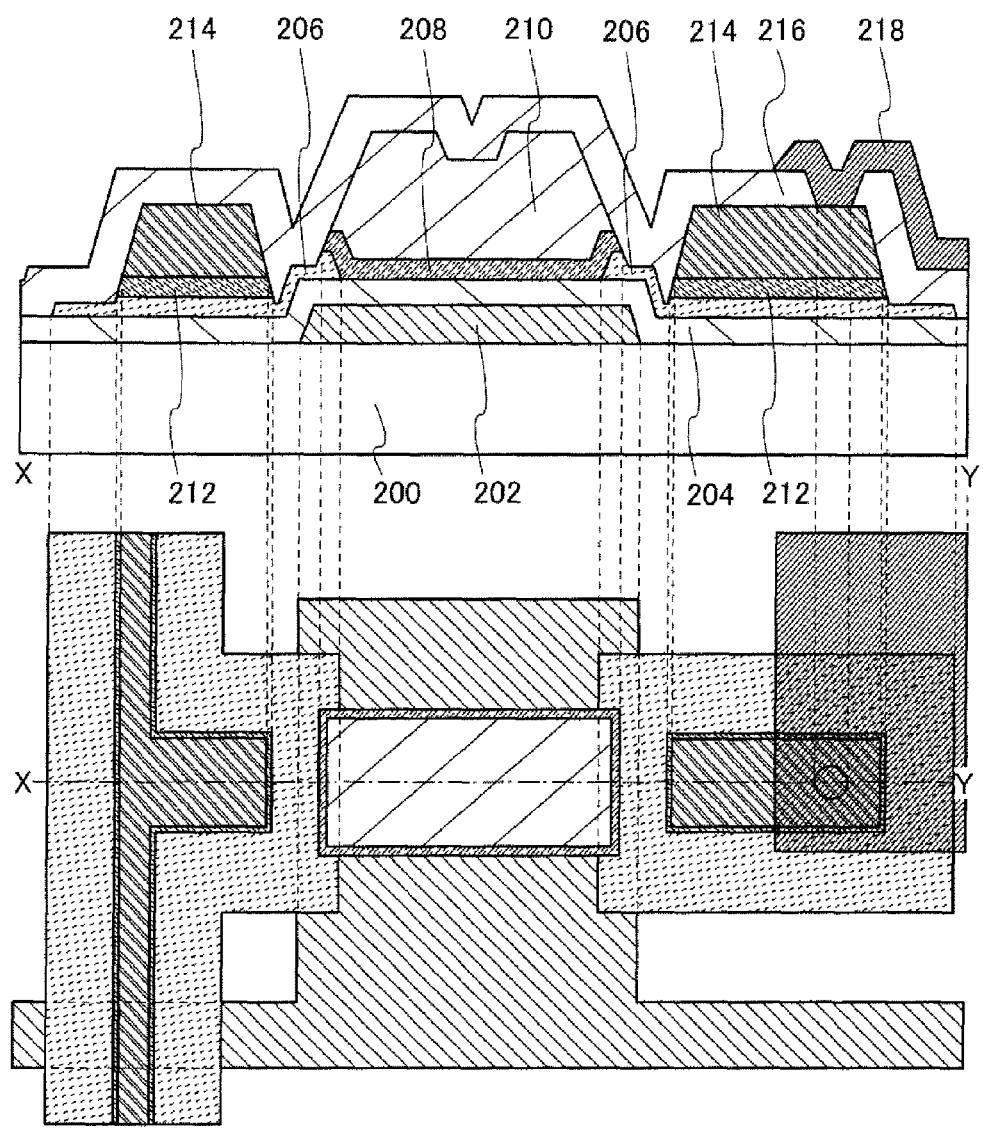
FIG. 5 is a cross-sectional view and a top view illustrating an example of a TFT according to one embodiment of the present invention.

Note that in the TFT in FIG. 5, the concentration of the impurity element imparting one-type conductivity included in the first impurity semiconductor layer 206 is preferably lower than the concentration of the impurity element imparting one-type conductivity included in second impurity semiconductor layer 212 so that an LDD region is provided.

Embodiment 3

The TFTs described in Embodiments 1 and 2 and a manufacturing method thereof can be applied to an array substrate of a display device. Consequently, a display device can be manufactured using pixel TFTs according to Embodiments 1 and 2.

Note that the display device includes an active matrix liquid crystal display device and an active matrix EL display device. However, the display device in this embodiment can be any display device which has TFTs without limitation thereto.

The TFTs described in Embodiment 1 and Embodiment 2 have small light-induced leakage current and a high On/Off ratio. Accordingly, the display device in this embodiment has a high contrast ratio and low power consumption.

Embodiment 4

The display device described in Embodiment 3 can be applied to a variety of electronic appliances (including game machines). Examples of electronic appliances include a television set (also referred to as a television or a television receiver), a monitor of a computer, an electronic paper, a camera such as a digital camera or a digital video camera, a digital photo frame, a cellular phone (also referred to as a mobile phone or a mobile phone set), a portable game console, a portable information terminal, an audio playback device, a large-sized game machine such as a pachinko machine, and the like.

The display device described in Embodiment 3 can be applied to an electronic paper, for example. An electronic paper can be used for electronic appliances in every field for displaying information. For example, an electronic paper can be used for an electronic book reader (an e-book reader), posters, advertisement in vehicles such as trains, or display portions of various cards such as credit cards. An example of an electronic appliance is illustrated in FIGS. 9A to 9D.

Figure 9A:
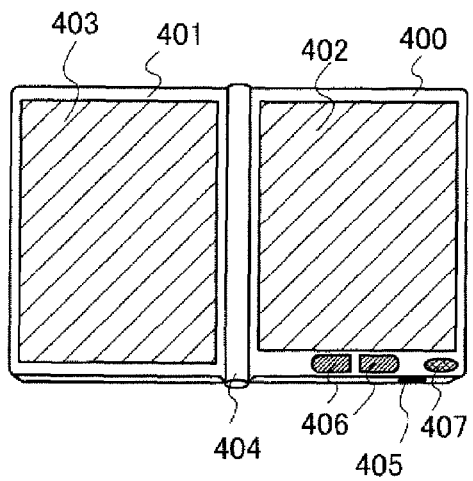
FIGS. 9A to 9D illustrate examples of an electronic appliance according to one embodiment of the present invention.

FIG. 9A illustrates an example of an electronic book reader. The electronic book reader in FIG. 9A includes a housing 400 and a housing 401. The housing 400 and the housing 401 are combined with a hinge 404 so that the electronic book reader can be opened and closed. With such a structure, the electronic book reader can be handled like a paper book.

A display portion 402 is mounted on the housing 400 and a display portion 403 is mounted on the housing 401. The display portion 402 and the display portion 403 may form one or different display screens. In the case where the display portion 402 and the display portion 403 each form a different display screen, for example, the right display portion (the display portion 402 in FIG. 9A) can display text and the left display portion (the display portion 403 in FIG. 9A) can display images. The display device described in Embodiment 3 can be applied to the display portions 402 and 403.

FIG. 9A illustrates an example in which the housing 400 is provided with an operation portion and the like. In FIG. 9A, the housing 400 is provided with a power input terminal 405, operation keys 406, a speaker 407, and the like. For example, the page can be turned with the operation key 406. Note that a keyboard, a pointing device, and the like may be provided on the same plane as the display portion of the housing 400. Further, a rear surface or a side surface of the housing 400 may be provided with an external connection terminal (an earphone terminal, a USB terminal, a terminal which can be connected with a variety of cables including a USB cable), a storage medium inserting portion, or the like. Moreover, the electronic book reader illustrated in FIG. 9A may have a function of an electronic dictionary.

Further, the electronic book reader illustrated in FIG. 9A may have a structure with which data can be sent and received wirelessly. Having such a structure with which data can be sent and received wirelessly, the electronic book reader may have a function with which desired book data or the like can be purchased and downloaded from an electronic book server wirelessly.

Figure 9B:
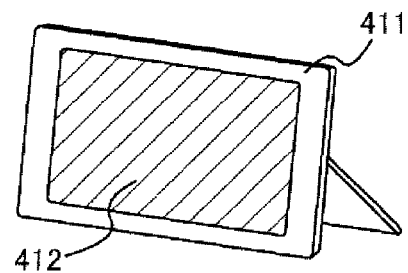

FIG. 9B illustrates an example of a digital photo frame. For example, in the digital photo frame illustrated in FIG. 9B, a display portion 412 is mounted on a housing 411. The display portion 412 can display a variety of images. For example, the display portion 412 displays image data taken with a digital camera or the like, so that the digital photo frame can function in a manner similar to a normal photo frame. The display device described in Embodiment 3 can be applied to the display portion 412.

Note that the digital photo frame illustrated in FIG. 9B may be provided with an operation portion, an external connection terminal (such as a USB terminal or a terminal which can be connected to a variety of cables including a USB cable), a storage medium inserting portion, and the like. They may be incorporated on the same plane as the display portion 412; however, they are preferably provided on a side surface or the rear surface to improve the design. For example, a storage medium having image data taken with a digital camera is inserted into the storage medium inserting portion of the digital photo frame and the image data is imported, whereby the imported image data can be displayed on the display portion 412.

The digital photo frame illustrated in FIG. 9B may additionally have a structure with which data can be sent and received wirelessly. Having such a structure with which data can be sent and received wirelessly, the digital photo frame may have a function of importing and displaying image data.

Figure 9C:
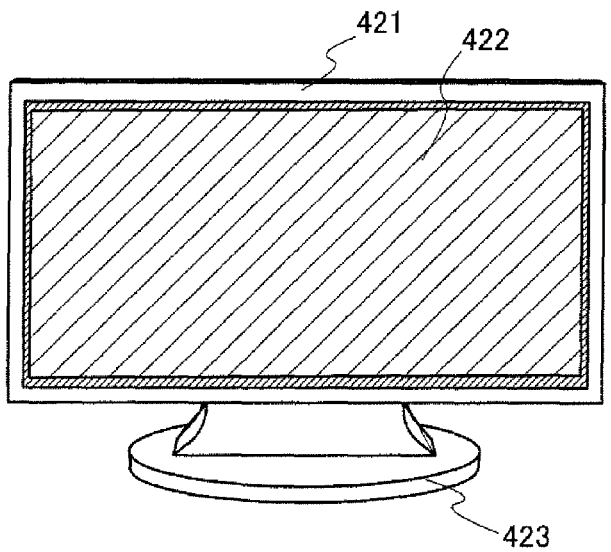

FIG. 9C illustrates an example of a television set. In the television set illustrated in FIG. 9C, a display portion 422 is mounted on a housing 421. Images can be displayed on the display portion 422. Here, a structure is shown in which the housing 421 is supported by a stand 423. The display device described in Embodiment 3 can be applied to the display portion 422.

The television set illustrated in FIG. 9C can be operated with an operation switch of the housing 421 or a remote control. With operation keys of the remote control, channels or volume can be controlled. Further, the remote control may be provided with a display portion for displaying data output from the remote control.

Note that the television set illustrated in FIG. 9C is provided with a receiver, a modem, and the like. With the receiver, a general television broadcast can be received. Further, when the television set is connected to a communication network by wired or wireless connection via the modem, one-way (from a transmitter to a receiver) or two-way (between a transmitter and a receiver, between receivers, or the like) data communication can be performed.

Figure 9D:
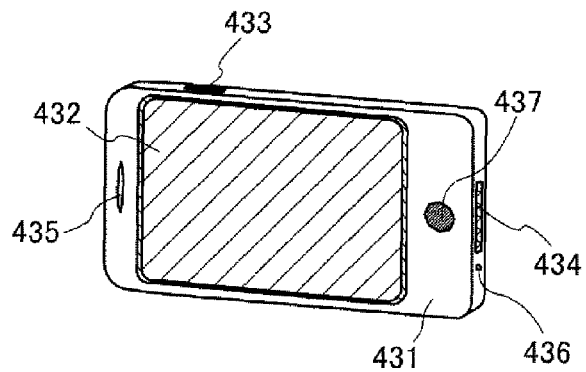

FIG. 9D illustrates an example of a cellular phone. The cellular phone illustrated in FIG. 9D is provided with a display portion 432 mounted on a housing 431, operation buttons 433 and 437, an external connection port 434, a speaker 435, a microphone 436, and the like. The display device described in Embodiment 3 can be applied to the display portion 432.

The display portion 432 of the cellular phone illustrated in FIG. 9D may be a touch screen in which contents displayed on the display portion 432 can be controlled by being touched with a finger or the like. In this case, a user can make a call or write a text message by touching the display portion 432 with a finger or the like.

There may be three screen modes of the display portion 432, for example: the first mode is a display mode mainly for displaying an image, the second mode is an input mode mainly for inputting data such as letters, and the third mode is a display-and-input mode in which two modes of the display mode and the input mode are combined.

For example, in the case of making a call or writing a text message, the display portion 432 may be placed in the input mode so that letters displayed on the screen may be input. In that case, it is preferable to display a keyboard or number buttons on a large area of the screen of the display portion 432.

It is also possible that a detection device including a sensor for detecting inclination, such as a gyroscope or an acceleration sensor, is provided inside the cellular phone illustrated in FIG. 9D, so that display data on the display portion 432 can be automatically switched by detecting the orientation of the cellular phone (whether the cellular phone is placed horizontally or vertically for a landscape mode or a portrait mode).

The screen modes may be switched by touching the display portion 432 or operating the operation button 437 of the housing 431. Alternatively, the screen modes may be switched depending on the kind of the image displayed on the display portion 432. For example, when a signal of an image displayed on the display portion is the one for moving images, the screen mode may be changed to the display mode. When the signal is the one for texts, the screen mode may be changed to the input mode.

Note that in the input mode, a signal is detected by an optical sensor in the display portion 432 and when input by touching the display portion 432 is not performed for a certain period, the screen mode may be switched from the input mode to the display mode.

The display portion 432 can also function as an image sensor. For example, an image of a palm print, a fingerprint, or the like is taken by the image sensor by touching the display portion 432 with the palm or the finger, whereby personal authentication can be performed. Note that by using a backlight or sensing light source which emits near-infrared light for the display portion 432, an image of finger veins, palm veins, or the like can be taken.

Figure 10A:
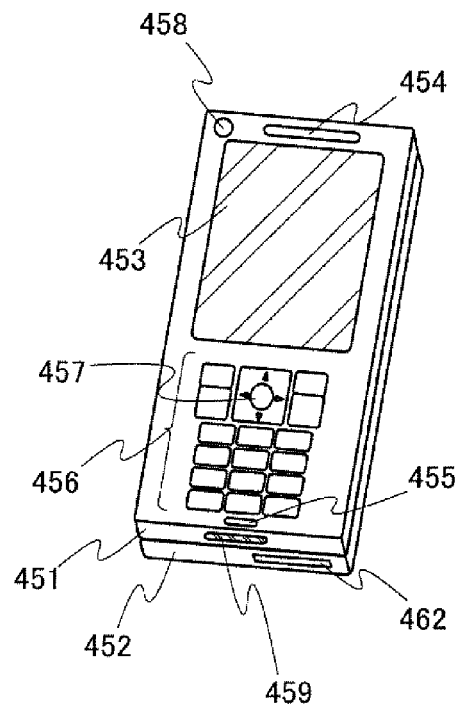
FIGS. 10A to 10C illustrate an example of an electronic appliance according to one embodiment of the present invention.
Figure 10B:
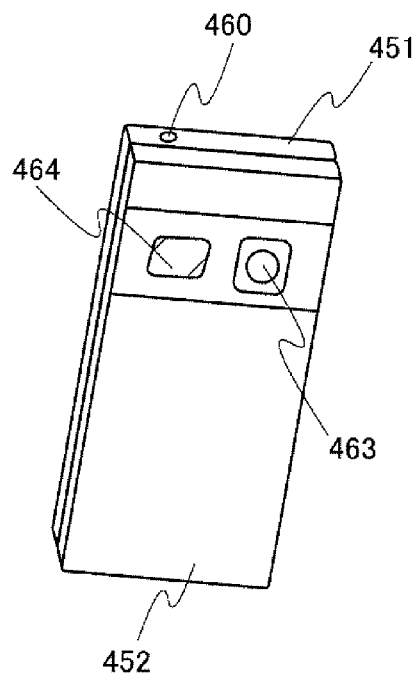
Figure 10C:
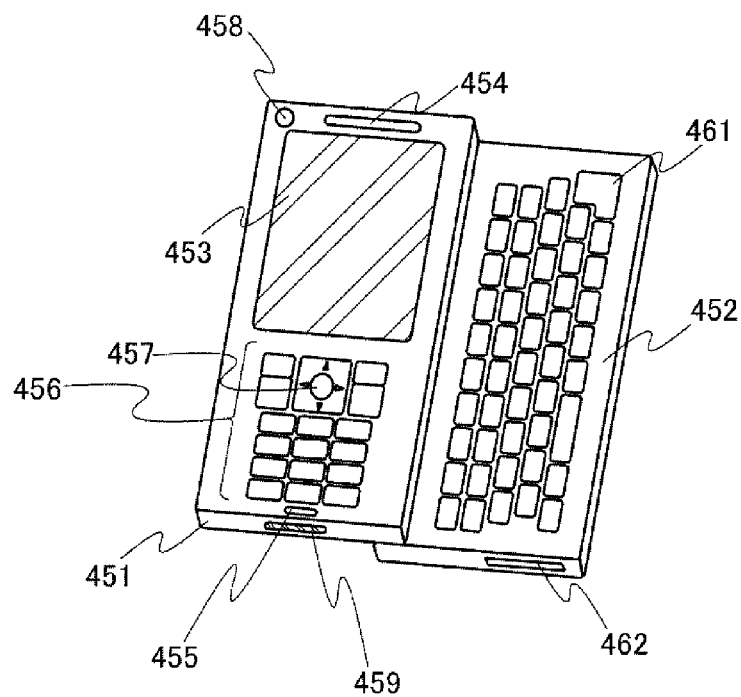

FIGS. 10A to 10C illustrate another example of a cellular phone. FIG. 10A is a front view, and FIG. 10B is a rear view, and FIG. 10C is a front view in which two housings are slid. The cellular phone includes two housings, a housing 451 and a housing 452. The cellular phone is a so-called smartphone which has both functions of a cellular phone and a portable information terminal, incorporates a computer, and is capable of various data processing in addition to voice calls.

The housing 451 includes a display portion 453, a speaker 454, a microphone 455, operation keys 456, a pointing device 457, a front camera lens 458, an external connection terminal jack 459, an earphone terminal 460, and the like, while the housing 452 includes a keyboard 461, an external memory slot 462, a rear camera 463, a light 464, and the like. In addition, the antenna is incorporated in the housing 451.

Further, in addition to the above structure, the cellular phone may incorporate a non-contact IC chip, a small memory device, or the like.

The housings 451 and 452 in FIG. 10A which overlap with each other can be slid to be developed as illustrated in FIG. 10C. The display device described in Embodiment 3 can be applied to the display portion 453. Since the display portion 453 and the front camera lens 458 are provided in the same plane, the smartphone can be used as a videophone. Further, still images and moving images can be taken with the rear camera 463 and the light 464 using the display portion 453 as a viewfinder.

With the use of the speaker 454 and the microphone 455, the cellular phone in FIGS. 10A to 10C can be used as an audio recording device (a recording device) or an audio playback device. Further, with the use of the operation keys 456, making and receiving calls, inputting simple information such as e-mails or the like, scrolling the screen displayed on the display portion, moving the cursor for selecting information to be displayed on the display portion, and the like are possible.

Note that the housing 451 and the housing 452 which overlap with each other can be slid to be developed as illustrated in FIG. 10C. In the case of using the smartphone for the preparation of documents or used as a portable information terminal, the keyboard 461 and the pointing device 457 may be used. The external connection terminal 459 can be connected to an AC adaptor and various types of cables such as a USB cable, and charge of the cellular phone, data communication with a personal computer, or the like are possible. Furthermore, a large amount of data can be stored and moved with a storage medium inserted into the external memory slot 462.

In the rear surface of the housing 452 (see FIG. 10B), the rear camera 463 and the light 464 are provided, and still images and moving images can be taken using the display portion 453 as a viewfinder.

Further, the cellular phone may have an infrared communication function, a USB port, a function of receiving one segment television broadcast, a non-contact IC chip, an earphone jack, or the like, in addition to the above functions and structures.

This application is based on Japanese Patent Application serial no. 2009-128691 filed with Japan Patent Office on May 28, 2009, the entire contents of which are hereby incorporated by reference.

What is claimed is:

1. A thin film transistor comprising:
   a first wiring layer;
   a gate insulating layer that covers the first wiring layer;
   a pair of first impurity semiconductor layers over the gate insulating layer, the pair of first impurity semiconductor layers partly overlapping with the first wiring layer;
   a semiconductor layer between the pair of first impurity semiconductor layers, the semiconductor layer being in contact with the pair of first impurity semiconductor layers;
   a pair of second impurity semiconductor layers,
   wherein one of the pair of second impurity semiconductor layers covers at least an outer end portion of one of the pair of first impurity semiconductor layers,
   wherein the other of the pair of second impurity semiconductor layers covers at least an outer end portion of the other of the pair of first impurity semiconductor layers, and
   wherein the pair of second impurity semiconductor layers is spaced from and does not overlap the semiconductor layer; and
   a second wiring layer over at least one of the pair of second impurity semiconductor layers.

2. The thin film transistor according to claim 1, wherein the semiconductor layer comprises microcrystalline silicon.

3. The thin film transistor according to claim 1, further comprising a channel stop layer over the semiconductor layer.

4. The thin film transistor according to claim 1,
   wherein a concentration of an impurity element imparting one-type conductivity included in the pair of first impurity semiconductor layers is $1.0 \times 10^{18}$ cm$^{-3}$ to $1.0 \times 10^{19}$ cm$^{-3}$ inclusive, and
   wherein a concentration of the impurity element imparting the one-type conductivity included in the pair of second impurity semiconductor layers is $1.0 \times 10^{19}$ cm$^{-3}$ to $1.0 \times 10^{21}$ cm$^{-3}$ inclusive.

5. The thin film transistor according to claim 1,
   wherein the second wiring layer is provided over an entire surface of the at least one of the pair of second impurity semiconductor layers.

6. A display device comprising:
   a pixel electrode layer; and
   the thin film transistor according to claim 1,
   wherein the pixel electrode layer is electrically connected to the second wiring layer of the thin film transistor.

7. An electronic appliance comprising: the display device according to claim 6.

8. The thin film transistor according to claim 1,
   wherein the semiconductor layer is partly over the pair of first impurity semiconductor layers.

9. The thin film transistor according to claim 1,
   wherein the entire semiconductor layer overlaps the first wiring layer.

10. The thin film transistor according to claim 1,
    wherein the pair of first impurity semiconductor layers is in contact with the gate insulating layer.

11. A thin film transistor comprising:
    a first wiring layer;
    a gate insulating layer that covers the first wiring layer;
    a pair of first impurity semiconductor layers over the gate insulating layer, the pair of first impurity semiconductor layers partly overlapping with the first wiring layer;
    a semiconductor layer between the pair of first impurity semiconductor layers, the semiconductor layer being in contact with the pair of first impurity semiconductor layers;
    a pair of second impurity semiconductor layers,
    wherein one of the pair of second impurity semiconductor layers is provided over one of the pair of first impurity semiconductor layers,
    wherein the other of the pair of second impurity semiconductor layers is provided over the other of the pair of first impurity semiconductor layers, and
    wherein the pair of second impurity semiconductor layers is spaced from and does not overlap the semiconductor layer; and
    a second wiring layer over at least one of the pair of second impurity semiconductor layers.

12. The thin film transistor according to claim 11,
    wherein the semiconductor layer comprises microcrystalline silicon.

13. The thin film transistor according to claim 11, further comprising a channel stop layer over the semiconductor layer.

14. The thin film transistor according to claim 11,
    wherein a concentration of an impurity element imparting one-type conductivity included in the pair of first impurity semiconductor layers is $1.0 \times 10^{18}$ cm$^{-3}$ to $1.0 \times 10^{19}$ cm$^{-3}$ inclusive, and
    wherein a concentration of the impurity element imparting the one-type conductivity included in the pair of second impurity semiconductor layers is $1.0 \times 10^{19}$ cm$^{-3}$ to $1.0 \times 10^{21}$ cm$^{-3}$ inclusive.

15. The thin film transistor according to claim 11,
wherein the second wiring layer is provided over an entire surface of the at least one of the pair of second impurity semiconductor layers.

16. A display device comprising:
a pixel electrode layer; and
the thin film transistor according to claim 11,
wherein the pixel electrode layer is electrically connected to the second wiring layer of the thin film transistor.

17. An electronic appliance comprising: the display device according to claim 16.

18. The thin film transistor according to claim 11,
wherein the semiconductor layer is partly over the pair of first impurity semiconductor layers.

19. The thin film transistor according to claim 11,
wherein the entire semiconductor layer overlaps the first wiring layer.

20. The thin film transistor according to claim 11,
wherein the entire one of the pair of second impurity semiconductor layers is narrower than and overlaps the one of the pair of first impurity semiconductor layers, and
wherein the entire other of the pair of second impurity semiconductor layers is narrower than and overlaps the other of the pair of first impurity semiconductor layers.

* * * * *